United States Patent
Maekawa et al.

(10) Patent No.: US 7,863,114 B2
(45) Date of Patent: *Jan. 4, 2011

(54) MANUFACTURING METHOD OF SEMICONDUCTOR DEVICE

(75) Inventors: Shinji Maekawa, Kanagawa (JP); Hidekazu Miyairi, Tochigi (JP)

(73) Assignee: Semiconductor Energy Laboratory Co., Ltd., Kanagawa-Ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/971,085

(22) Filed: Jan. 8, 2008

(65) Prior Publication Data

US 2008/0138944 A1 Jun. 12, 2008

Related U.S. Application Data

(63) Continuation of application No. 10/721,251, filed on Nov. 26, 2003, now Pat. No. 7,335,255.

(30) Foreign Application Priority Data

Nov. 26, 2002 (JP) ............................ 2002-342695

(51) Int. Cl.
*H01L 21/00* (2006.01)
*H01L 21/84* (2006.01)

(52) U.S. Cl. ................ 438/149; 438/150; 257/E21.561

(58) Field of Classification Search ................ 438/166, 438/479, 149, 150, 192
See application file for complete search history.

(56) References Cited

U.S. PATENT DOCUMENTS

| 4,599,133 A | 7/1986 | Miyao et al. |
| 5,426,064 A | 6/1995 | Zhang et al. |
| 5,543,352 A | 8/1996 | Ohtani et al. |
| 5,580,792 A | 12/1996 | Zhang et al. |
| 5,643,826 A | 7/1997 | Ohtani et al. |
| 5,814,540 A | 9/1998 | Takemura et al. |
| 5,879,977 A | 3/1999 | Zhang et al. |
| 6,072,193 A | 6/2000 | Ohnuma et al. |
| 6,110,770 A | 8/2000 | Zhang et al. |
| 6,451,638 B1 | 9/2002 | Zhang et al. |
| 6,706,568 B2 | 3/2004 | Nakajima |
| 6,713,323 B2 | 3/2004 | Yamazaki et al. |
| 6,730,550 B1 | 5/2004 | Yamazaki et al. |
| 6,753,212 B2 | 6/2004 | Yamazaki et al. |

(Continued)

FOREIGN PATENT DOCUMENTS

EP 0 651 431 A2 5/1995

(Continued)

*Primary Examiner*—Choung A Luu
*Assistant Examiner*—Nga Doan
(74) *Attorney, Agent, or Firm*—Nixon Peabody LLP; Jeffrey L. Costellia

(57) ABSTRACT

The present invention provides a method for removing a metal element effectively from a crystalline semiconductor film obtained with the use of the metal element, without increasing the number of processes. In the present invention, an amorphous semiconductor film is formed on an insulating surface, a metal element for promoting crystallization is added to the amorphous semiconductor film, the amorphous semiconductor film is heated to form a crystallized semiconductor film, a continuous wave laser beam is irradiated to the crystallized semiconductor film, and an upper portion of the crystallized semiconductor film is removed.

16 Claims, 7 Drawing Sheets

U.S. PATENT DOCUMENTS

| | | |
|---|---|---|
| 6,803,296 B2 | 10/2004 | Miyairi |
| 6,858,480 B2 | 2/2005 | Nakamura et al. |
| 6,974,731 B2 | 12/2005 | Yamazaki et al. |
| 7,033,871 B2 | 4/2006 | Nakamura et al. |
| 7,109,073 B2 | 9/2006 | Yamazaki |
| 7,141,822 B2 | 11/2006 | Nakamura et al. |
| 7,335,255 B2* | 2/2008 | Maekawa et al. ............... 117/5 |
| 7,605,029 B2 | 10/2009 | Nakamura et al. |
| 7,709,302 B2 | 5/2010 | Nakajima |
| 2002/0013022 A1 | 1/2002 | Yamazaki et al. |
| 2002/0048864 A1 | 4/2002 | Yamazaki et al. |
| 2002/0094612 A1* | 7/2002 | Nakamura et al. .......... 438/149 |
| 2002/0098628 A1 | 7/2002 | Hamada et al. |
| 2002/0125539 A1* | 9/2002 | Oguchi ...................... 257/400 |
| 2003/0059990 A1* | 3/2003 | Yamazaki ................... 438/166 |
| 2004/0092061 A1 | 5/2004 | Kawasaki et al. |
| 2004/0140470 A1 | 7/2004 | Kawasaki et al. |
| 2004/0224449 A1 | 11/2004 | Yamazaki et al. |
| 2006/0292761 A1 | 12/2006 | Yamazaki |
| 2007/0020826 A1 | 1/2007 | Yamazaki |
| 2007/0037309 A1 | 2/2007 | Nakamura et al. |
| 2010/0155737 A1 | 6/2010 | Nakajima |

FOREIGN PATENT DOCUMENTS

| | | |
|---|---|---|
| JP | 06-260651 | 9/1994 |
| JP | 06-267849 | 9/1994 |
| JP | 07-161634 | 6/1995 |
| JP | 07-183540 | 7/1995 |
| JP | 08-255916 | 10/1996 |
| JP | 09-213630 | 8/1997 |
| JP | 10-144923 | 5/1998 |
| JP | 10-335672 | 12/1998 |
| JP | 3107941 | 9/2000 |
| JP | 2001-274085 | 10/2001 |
| JP | 2002-313722 | 10/2002 |
| JP | 2002-324808 | 11/2002 |
| JP | 2002-329666 | 11/2002 |

* cited by examiner

Concentration of Ni in Semiconductor Film in Depth Direction
(sample structure: cap a-Si/poly-Si/SiON/SiNO//glass)

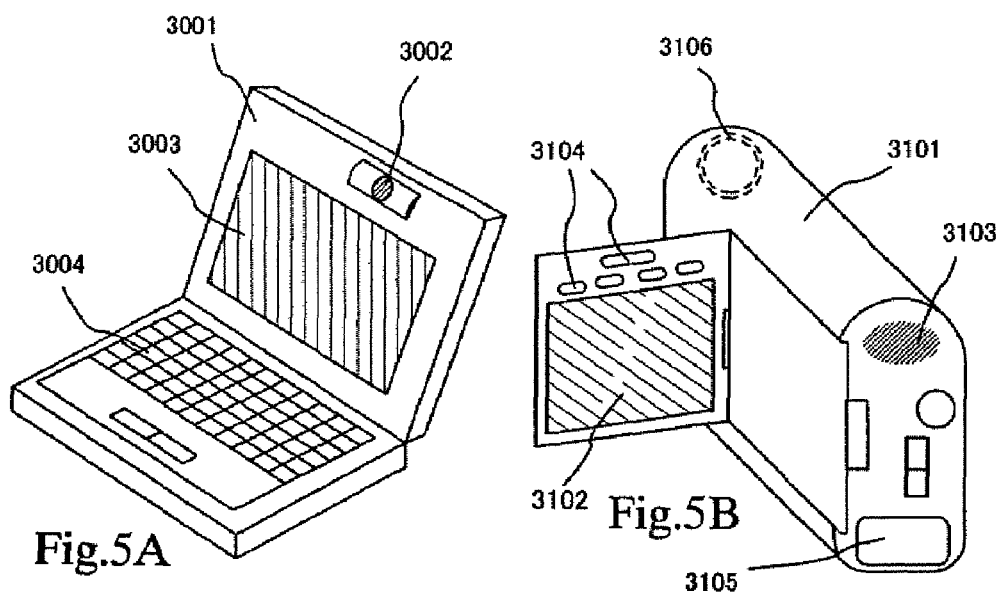
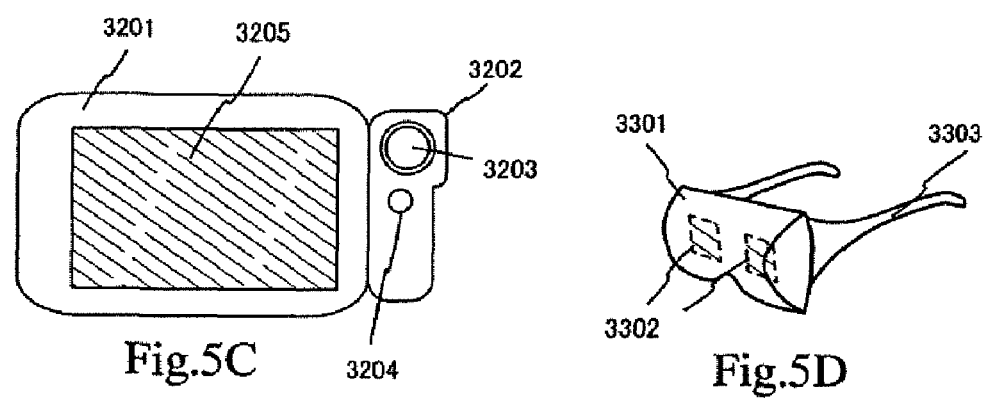
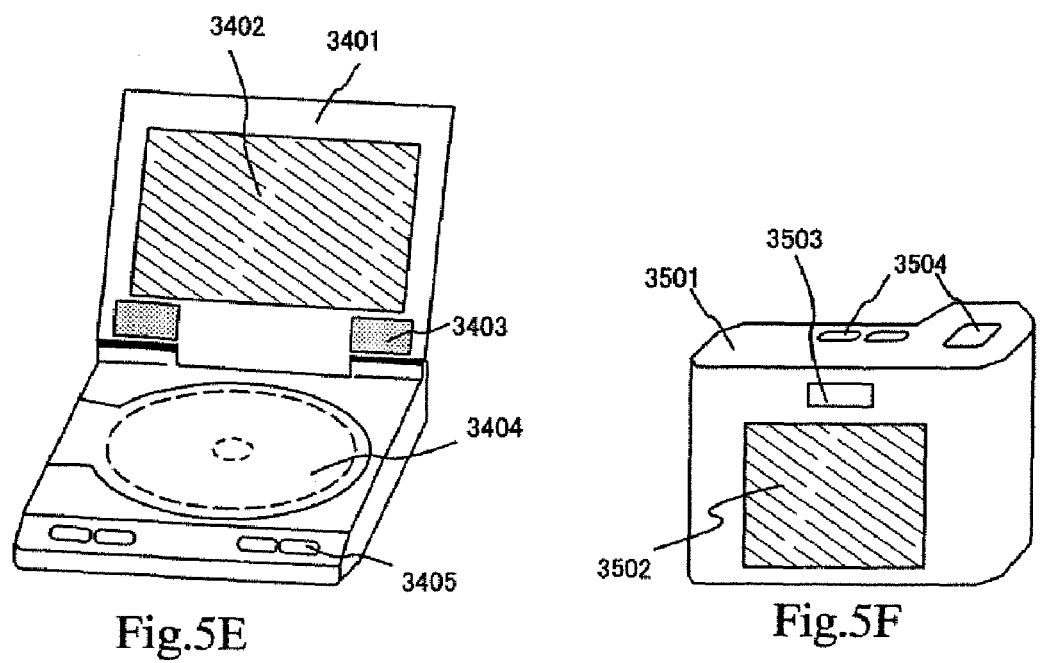

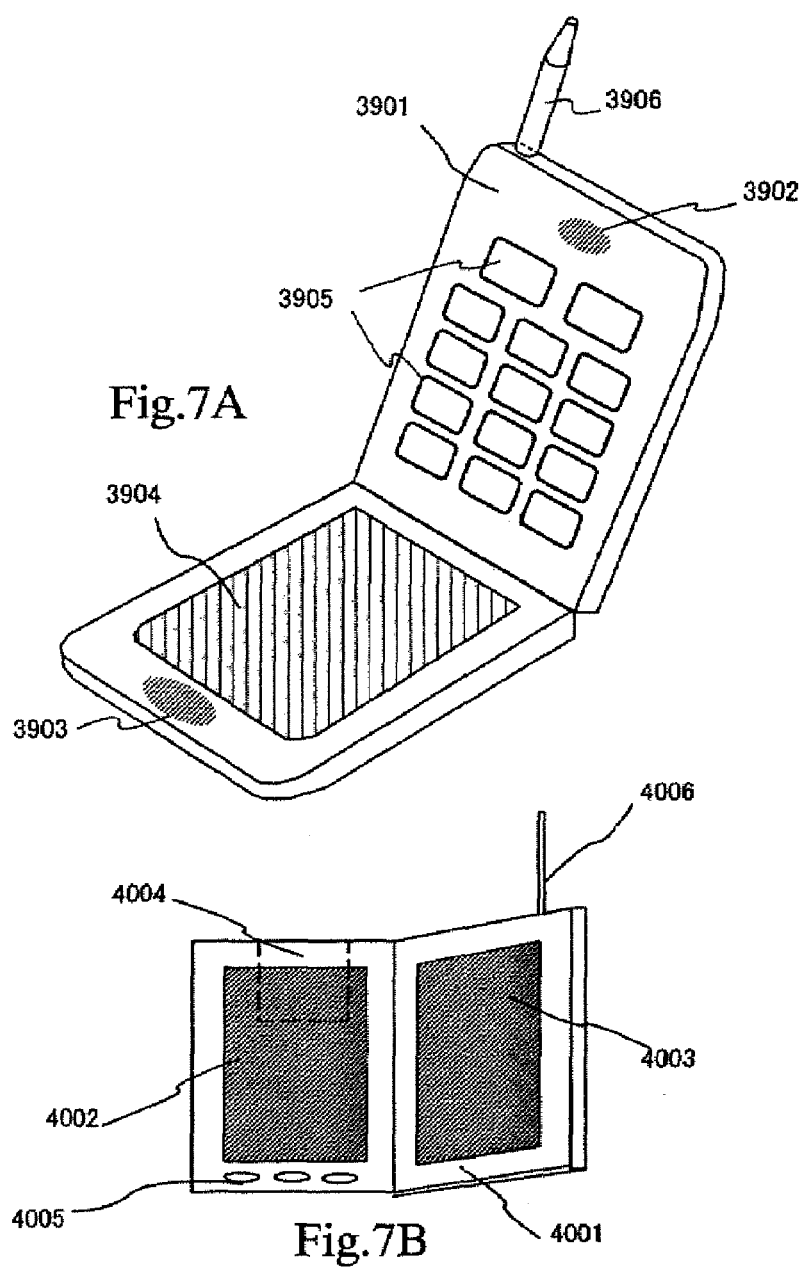

MANUFACTURING METHOD OF SEMICONDUCTOR DEVICE

BACKGROUND OF THE INVENTION

1. Field of the Invention

The present invention relates to a method for manufacturing a semiconductor device that uses semiconductor with a crystalline structure, more specifically to a method for manufacturing a device such as a thin film transistor, a thin film diode, or a field emission device, which uses a crystalline semiconductor film.

2. Description of the Related Arts

A semiconductor circuit, an electro-optical device, or a light emitting device, which has a driving circuit and a pixel portion formed using a semiconductor device (typically, a thin film transistor, a thin film diode, or a field emission device), and an electronic device that uses the semiconductor circuit, the electro-optical device, or the light emitting device have actively been manufactured. As an active layer of the semiconductor device, a semiconductor film is used, and in particular, a crystalline silicon film is used to realize high field effect mobility.

An element of electrical characteristics of a thin film transistor depends on quality of a semiconductor film. In particular, field effect mobility depends on crystallinity of a semiconductor film, and the field effect mobility is directly concerned with response properties of a thin film transistor and display ability of a display device manufactured using the thin film transistor for a circuit.

Now, in order to form a thin film transistor with high electrical characteristics, the technique of performing one or both of thermal annealing and laser annealing with respect to an amorphous semiconductor film formed on an insulating substrate such as glass to improve crystallinity of the amorphous semiconductor film, and further to form a crystalline semiconductor film, has been widely studied.

However, when thermal annealing or laser annealing is used with respect to an amorphous semiconductor film formed with plasma CVD or sputtering to form a crystalline semiconductor film, the crystal orientation is likely to be oriented in any direction and it is difficult to control the crystal orientation. Accordingly, it is a cause of limiting electrical characteristics of a thin film transistor to use a crystalline semiconductor film crystallized by thermal annealing or laser annealing as an active layer of the thin film transistor.

As a method for crystallizing an amorphous semiconductor film, a method described in Japanese Patent Laid-Open No. Hei 07-183540 can be given. The crystallizing method will be briefly explained below. First, an amorphous semiconductor film is doped with a slight amount of metal element such as nickel, iron, cobalt, palladium, or platinum typically. For doping with the metal element, plasma treatment, evaporation, ion implantation, sputtering, or application of solution may be used. After that, when the amorphous semiconductor film is heated in a nitrogen atmosphere at a low temperature, for example, 550° C., a reaction of crystallization occurs with a compound of the metal element and an element of the semiconductor film (typically, nickel silicide, iron silicide, cobalt silicide, platinum silicide, or palladium silicide) as a nucleus so that a crystalline semiconductor film is formed.

It is confirmed that a semiconductor film can be enhanced to have the crystal orientation in a single direction and a semiconductor film composed of crystal grains with a large grain size can be formed when the method is used for crystallization. In addition, it is also confirmed that there are few defects in the crystal grains. Therefore, when a moving direction of a carrier is aligned with an extending direction of a formed crystal grain, it is possible to reduce extremely the number of times a carrier cuts across a grain boundary. Accordingly, it becomes possible to reduce fluctuation in on-current (drain current flowing in an on-state of a thin film transistor), off-current (drain current flowing in an off-state of a thin film transistor), threshold voltage, S-value, and field effect mobility, and electrical characteristics are remarkably improved. It is noted that conditions such as an appropriate heating temperature and an appropriate heating time depends on a dosage of the metal element and a state of the amorphous semiconductor film.

Since the amorphous semiconductor film is doped with the metal element, however, the metal element (a silicide of the metal element in the case of the semiconductor film of silicon, which exists typically as nickel silicide, iron silicide, cobalt silicide, platinum silicide, or palladium silicide) remains in the semiconductor film or on a surface thereof. The remaining metal element becomes a path of leakage current to increase off-current of a thin film transistor, which has trouble of becoming a cause of fluctuation in electrical characteristics among thin film transistors. Therefore, it is necessary to remove the metal element in a semiconductor film or to reduce a concentration of the metal element (hereinafter, referred to as a gettering process) after crystallizing the amorphous semiconductor film.

Consequently, the present applicant discloses a method for removing a metal element in a crystalline semiconductor film in each of Japanese Patent No. 3107941 (pages to and FIGS. 3A to 3E), Japanese Patent Laid-Open No. Hei 07-161634 (pages 7 to 8 and FIGS. 3A to 3E), Japanese Patent Laid-Open No. 10-335672 (pages 4 to 7 and FIGS. 1A to 2D), and Japanese Patent Laid-Open No. 2002-324808 (pages 7 to 10 and FIGS. 1A to 2D).

In Japanese Patent No. 3107941, it is disclosed that solution including a metal element (nickel) for promoting crystallinity of semiconductor is applied to a surface of an amorphous semiconductor film, a crystalline semiconductor film is formed by heating, and etching with solution including hydrochloric acid is performed to nickel silicide to remove nickel (nickel silicide) in the semiconductor film.

In Japanese Patent Laid-Open No. Hei 07-161634, it is disclosed that solution including a metal element for promoting crystallinity of semiconductor is applied to a surface of an amorphous semiconductor film, a crystalline semiconductor film is formed by heating, pulse oscillation excimer laser is irradiated to promote crystallization, and etching into any shape is performed to the semiconductor film.

In Japanese Patent Laid-Open No. Hei 10-335672, it is disclosed that source and drain regions of a thin film transistor are doped with phosphorus and heating at a temperature from 450 to 700° C. is conducted to remove a metal element for promoting crystallization of the semiconductor film from a channel forming region of a thin film transistor.

In Japanese Patent Laid-Open No-2002-324808, it is disclosed that a semiconductor film (hereinafter, a semiconductor film B in the present paragraph) including a rare gas element such as argon at a concentration from $1 \times 10^{19}$ to $1 \times 10^{22}/cm^3$ is formed over a crystalline semiconductor film (hereinafter, a semiconductor film A in the present paragraph) with a barrier film (a film such as a silicon oxide film) provided therebetween, a metal element for promoting crystallization is moved from the semiconductor A to the semiconductor B, and the semiconductor film B is removed to remove the metal element from the crystalline semiconductor film (the semiconductor film A) of a thin film transistor.

In the gettering process to the metal element, disclosed in Japanese Patent No. 3107941, however, the process (such as laser irradiation) for planarization of asperity of the surface is needed additionally since only the metal compound in the semiconductor film, typically, nickel silicide, is removed. Further, only nickel silicide separating out on the surface of the semiconductor film can be removed, which has trouble that no nickel silicide in the semiconductor film can be removed.

In Japanese Patent Laid-Open No. Hei 07-161634, pulse oscillation laser such as excimer laser is used in irradiation for promoting crystallization after heating the amorphous semiconductor film. Since laser light emitted from pulse oscillation laser has a low energy density, the semiconductor film has a region melted by irradiation of laser light, specifically, an amorphous portion and a surface of the semiconductor film. Consequently, a crystalline region of the semiconductor film is not melted, which has trouble of a metal compound, typically, nickel silicide, remaining in the crystalline region.

The gettering processes disclosed in Japanese Patent Laid-Open No. 10-335672 and Japanese Patent Laid-Open No. 2002-324808 have many processes, which has trouble of a cause of lower yield.

SUMMARY OF THE INVENTION

The present invention has been made in view of the above problems. It is an object of the present invention to provide a method for removing a metal element effectively from a crystalline semiconductor film obtained with the use of the metal element, without increasing the number of processes.

In the present invention, an amorphous semiconductor film is formed on an insulating surface, a metal element for promoting crystallization is added to the amorphous semiconductor film, the amorphous semiconductor film is heated to form a crystallized semiconductor film, a continuous wave laser beam is irradiated to the crystallized semiconductor film, and an upper portion of the crystallized semiconductor film, to which the continuous wave laser beam is irradiated, is removed.

The upper portion is a portion that includes a region with the metal element segregated.

In the present invention, an amorphous semiconductor film is formed on an insulating surface, a metal element for promoting crystallization is added to the amorphous semiconductor film, the amorphous semiconductor film is heated to form a crystallized semiconductor film, a continuous wave laser beam is irradiated to the crystallized semiconductor film, and an upper portion of the crystallized semiconductor film is removed to reduce a concentration of the metal element in the crystallized semiconductor film to a lower detection limit of SIMS (secondary ion mass spectroscopy).

The lower detection limit of SIMS (secondary ion mass spectroscopy) is $1 \times 10^{17}/cm^3$.

In order to remove the upper portion, one of wet etching, dry etching, and CMP (Chemical Mechanical Polishing) is used.

As the continuous wave laser beam, a continuous wave laser beam in a wavelength band absorbed in the crystallized semiconductor film, that is, a continuous wave laser beam that has a wavelength from 100 to 600 nm, is applied. As a laser oscillator, a gas laser oscillator or a solid laser oscillator is applied. As the gas laser oscillator, a laser oscillator using He—Ne, Ar or Kr is used. As the solid laser oscillator, a laser oscillator using a crystal such as YAG, $YVO_4$, YLF, or $YAlO_3$ doped with Cr, Nd, Er, Ho, Ce, Co, Ti, or Tm is applied. Alternatively, glass laser, ruby laser, alexandrite laser, or Ti:sapphire laser may be used as the solid laser. In the case of the solid laser oscillator, it is preferable to apply one of second to fourth harmonics of a fundamental wave.

In the case of using the laser above, it is effective to condense a laser beam emitted from a laser oscillator into a linear shape with an optical system to irradiate to a semiconductor film since the laser beam can be irradiated to a whole substrate for a short time.

The present inventors have found out that, when a continuous laser beam is irradiated to a crystalline semiconductor film formed by heating with the addition of a metal element, the metal element is segregated in the vicinity of a surface of the crystalline semiconductor film. FIG. 4 shows a concentration of a metal element (specifically, nickel) in a semiconductor film according to the present invention, which is a result measured with SIMS (secondary ion mass spectroscopy).

The structure of a sample used in the measurement has a lamination below of respective layers on a glass substrate. The structure is shown below.

"Glass//SiNO: 50 nm/SiON: 100 nm/poly-Si: 150 nm/cap a-Si: 50 nm" (glass substrate/silicon oxynitride film: 50 nm/silicon oxynitride film (different composition ratio): 100 nm/crystalline silicon film: 150 nm/amorphous silicon film: 50 nm)

The crystalline silicon film is an active layer shown as a region "poly-Si" in FIG. 4, and the amorphous silicon film is a protective layer shown as a region "cap a-Si" in FIG. 4.

It is noted that the silicon oxynitride film and the silicon oxynitride film (different composition ratio) are deposited with a known method. The crystalline silicon film is formed by applying solution including nickel (concentration of nickel: 10 ppm) on an amorphous silicon film formed with a known method and heating. After that, the amorphous silicon film is formed as the protective film.

In measurement with SIMS (secondary ion mass spectroscopy), a profile at the beginning of the measurement is accompanied by uncertainty due to a transient area (a region till equilibrium of irradiated primary ions and ions from a surface of the sample) and a state of the surface of the sample. Consequently, the amorphous semiconductor film as the protective layer is provided.

Here, solution including nickel at 10 ppm is used. When solution including nickel more than 10 ppm is used to crystallize a semiconductor film, a region in which nickel is segregated is increased in the semiconductor film, an etching process takes a longer time, and nickel has a high probability of remaining in an active layer. On the other hand, when solution including nickel less than 10 ppm is used to crystallize a semiconductor film, the crystallization of the semiconductor film is insufficient as a whole and a less crystalline semiconductor film is formed. Consequently, the solution including nickel at 10 ppm is used in the present invention.

In FIG. 4, a dotted line shows a concentration of nickel in sample 1) where a crystalline semiconductor film formed according to a conventional manufacturing method is used as an active layer, specifically, a continuous wave laser beam is not irradiated and an amorphous silicon film is deposited as a protective layer. On the other hand, a solid line shows a concentration of nickel in sample 2) where a crystalline semiconductor film formed according to the present invention is used as an active layer, specifically, a continuous wave laser beam is irradiated and an amorphous silicon film is deposited as a protective layer. It is noted that conditions in laser irradiation is that second harmonic (532 nm) of $Nd:YVO_4$ laser is used, a scanning speed is 50 cm/sec, and an overlap ratio is 0%.

In the amorphous silicon film as the protective film (the region "cap a-Si" in FIG. 4), samples 1) and 2) have about the same concentration of nickel. In contrast, in the crystalline silicon film (the region "poly-Si" in FIG. 4), it is found that the concentration of nickel of sample 2) is high in a region from an interface between the region "cap a-Si" and the region "poly-Si" to 50 nm and is a lower detection limit ($1\times10^{17}/\text{cm}^3$) or less in a region from 50 to 150 nm whereas the concentration of nickel of sample 1) is uniform (about $2\times10^{18}/\text{cm}^3$) with respect to the depth direction. From the result above, it is understood that a metal element can be segregated in the vicinity of a surface of a crystalline semiconductor film by irradiating a continuous wave laser beam to the crystalline semiconductor film in the case of adding the metal element to an amorphous semiconductor film and heating to form the crystalline semiconductor film. Accordingly, it is possible to form a more crystalline semiconductor film including a metal element as an impurity at a lower concentration when at least a region from the surface of the semiconductor film to 50 nm is removed, preferably, a region including the region (from the surface to 50 nm) in which the metal element is segregated is removed to leave a necessary thickness for the crystalline semiconductor film, with a known method.

As the reason of the segregation by irradiation of the continuous wave laser beam, the following can be considered. Here, silicon is used as a representation of semiconductor elements.

The ratio of the solubility $[C_M]_S$ of a metal element in a solid phase to the solubility $[C_M]_L$ of the metal element in a liquid phase, "$k_0$" (equilibrium segregation coefficient) is constant and is represented by Formula 1, $$k_0 = [C_M]_S / [C_M]_L \quad \text{[Formula 1]}$$

The metal element in melting silicon diffuses in the melt to occupy an interstitial position of silicon. At a high temperature, the metal element occupying the interstitial position promptly diffuses in the bulk to come to equilibrium in concentration. In the case of the equilibrium segregation coefficient $k_0 < 1$, however, the metal element occupying the interstitial position becomes a precipitate in the solid phase as a metal silicide since the solubility at a low temperature is exceeded in a cooling process after thermal treatment. In this case, the metal element in the metal silicide as the precipitate in the solid phase gathers in the vicinity of a solid-liquid interface to diffuse toward the inside of the liquid phase when the semiconductor film becomes solidified at a diffusion rate or more. In short, the concentration of the metal element becomes high in front of the solid-liquid interface. The metal element is segregated in an upper portion of the semiconductor film, which finally exists as melt, that is, in the vicinity of the surface since the crystallization starts from an interface between the semiconductor film and a base film.

According to the reference of W. Zulehner and D. Huber: "Czochralski-grown silicon, Crystals 8: Silicon, chemical Ething, pp. 1-143, Springer-Verlag" (1982), the equilibrium segregation coefficient of nickel in silicon is $k_0 = 3 \times 10^{-5}$, and the equilibrium segregation coefficient of iron or cobalt is $8 \times 10^{-6}$. The time until solidification of melted silicon is short on the order of μsec. The metal element in melt of silicon, such as nickel, cobalt, or iron, is segregated in an upper portion of the semiconductor film, which finally exists as melt, that is, in the vicinity of the surface.

Since the continuous wave laser continuously emits a laser beam, the energy density of the continuous wave laser beam irradiated to an irradiated surface is higher compared to a pulse laser beam used conventionally. When a pulse laser beam is irradiated to a crystalline semiconductor film conventionally, the crystalline semiconductor film is partially melted, specifically, only a portion of amorphous semiconductor and a surface are melted. Consequently, a metal element included in the crystalline semiconductor film can not diffuse for segregation, and is dispersed all over the semiconductor film. On the other hand, a semiconductor film is melted in a wide area including the crystalline semiconductor film when the continuous wave laser beam is irradiated to the semiconductor film. Consequently, in recrystallization of the semiconductor film at cooling, the metal element included in the melt is segregated in an upper portion of the recrystallized semiconductor film in accordance with the reaction mechanism of segregation. In addition, the recrystallized semiconductor film has fewer defects since the semiconductor film is melted by irradiation of the continuous wave laser beam.

BRIEF DESCRIPTION OF THE DRAWINGS

In the accompanying drawings:

FIGS. 5A to 5F are diagrams showing examples of electronic apparatus;

FIGS. 7A to 7C are diagrams showing examples of electronic apparatus.

DESCRIPTION OF THE PREFERRED EMBODIMENTS

Embodiment Mode

With reference to FIGS. 1A to 1F, an explanation will be given on a method of adding a metal element with catalytic action to a entire surface of an amorphous semiconductor film, heating to crystallize the amorphous semiconductor film, and irradiating a continuous wave laser beam to perform gettering.

Figure 1A:
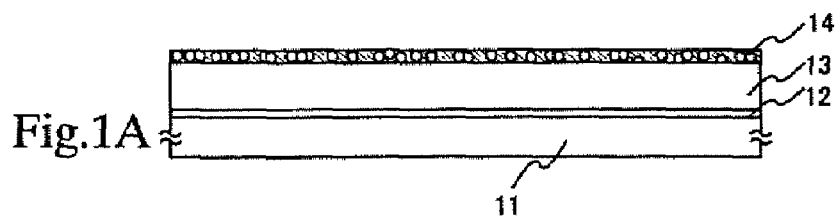
FIGS. 1A to 1F are diagrams showing an example of a conception of the present invention.

First, an explanation will be given on FIG. 1A. Although a material of a substrate 11 is not particularly limited, it is preferable to use a material such as barium borosilicate glass, aluminum borosilicate glass, or quartz. On a surface of the substrate 11, an inorganic insulating film is formed as a base film 12 to have a thickness from 10 to 200 mm. Although the base film has one layer in FIG. 1A, two or more layers may be formed. As preferred examples as the base film 12, a silicon oxide film, a silicon oxynitride film, and a silicon nitride film can be given.

Next, a semiconductor film 13 is formed on the base film 12 with the use of a known means (sputtering, LPCVD, or plasma CVD) to have a thickness from 80 to 200 nm (preferably, 100 to 150 nm). After that, solution 14 including a metal element such as nickel, iron, cobalt, platinum, or palladium is applied a surface of the semiconductor film 13. It is noted that a known method such as plasma CVD or sputtering may be used to add the metal element to the semiconductor film. In the present invention, an amorphous semiconductor film is formed to have a predetermined thickness with consideration for a portion to become an active layer and a region to be removed since the region including the metal element is removed after the amorphous semiconductor film is subjected to thermal crystallization.

Figure 1B:
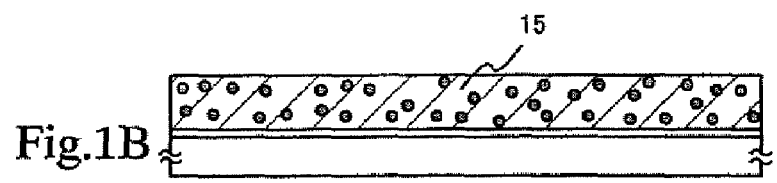

Next, the semiconductor film to which the metal element is added is heated at a temperature from 400 to 600° C. for 1 to 12 hours to form a crystalline semiconductor film 15 (FIG. 1B).

Figure 1C:
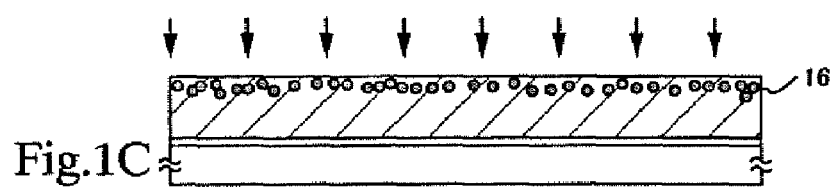

Next, a continuous wave laser beam is irradiated to the crystalline semiconductor film 15 to segregate the metal element 16, such as nickel, iron, cobalt, platinum, or palladium, in the crystalline semiconductor film 15 in the vicinity of a surface of the crystalline semiconductor film (FIG. 1C).

Figure 1D:
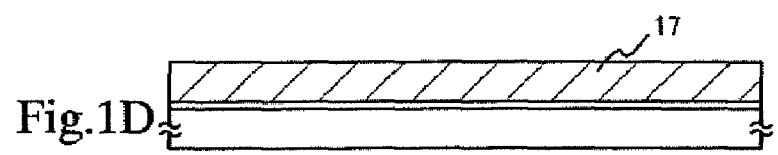
Figure 1E:
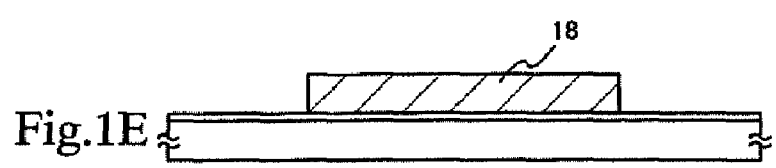

After that, an upper portion, that is, a region including the metal element, of the crystalline semiconductor film, is removed with a known method, as shown in FIG. 1D.

Then, patterning into a desired shape is performed to a semiconductor film 17 with crystallinity with the use of techniques of photolithography (FIG. 1E), and a first insulating film is formed as a gate insulating film 19. With a known method such as plasma CVD or sputtering, the gate insulating film 19 is formed of a single-layer structure of an insulating film or a laminated structure of insulating films to have a thickness from 40 to 150 nm.

Subsequently, a conductive film, for example, a film of a metal element, is formed on the gate insulating film 19, and patterning is performed with the use of techniques of photolithography to form a gate electrode 20. Although the conductive film has a single-layer structure here, two or more layers may be laminated. As a material of the conductive film, a metal material selected from Ta, W, Ti, Mo, Al, and Cu, an alloy or a compound containing the metal element as its main component may be used. Alternatively, a semiconductor film represented by a crystalline silicon film doped with an impurity element such as phosphorous may be used.

Figure 1F:
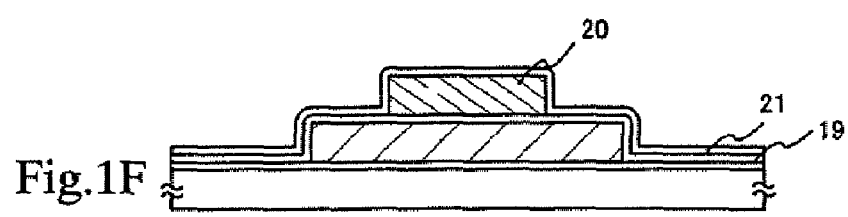

Next, a second insulating film 21 is formed to cover the gate electrode 20 and the gate insulating film 19. With a known method such as plasma CVD or sputtering, the second insulating film 21 is formed of a single-layer structure of an insulating film or a laminated structure of insulating films to have a thickness from 40 to 150 nm (FIG. 1F).

Next, with a known method, a semiconductor film 18 is doped with an impurity to form source and drain regions. After that, an interlayer insulating film is formed, contact holes are formed to reach the source and drain region, and wirings are formed to reach the source and drain region (not shown in the figure).

According to the processes above, it is possible to crystallize a semiconductor film and to perform gettering simply for a shorter time in crystallizing the semiconductor film with the use of a metal element. Accordingly, the crystal orientation can be enhanced in a single direction, and a semiconductor film composed of crystal grains with a large grain size can be formed with high yield.

EMBODIMENTS

Embodiment 1

In the present embodiment, an explanation will be given with reference to FIGS. 2A to 3C on a manufacturing method of a thin film transistor according to the present invention.

Figure 2A:
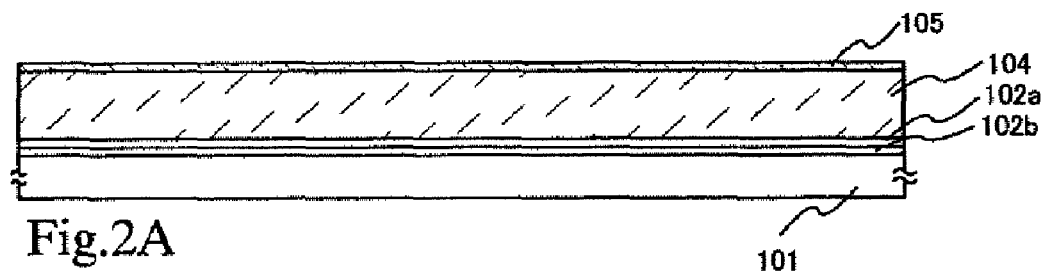
FIGS. 2A to 2D are sectional views showing a manufacturing process of a thin film transistor.

First, an explanation will be given with FIG. 2A. On a substrate 101, a base film 102 is formed of an insulating film such as a silicon oxide film, a silicon nitride film, or a silicon oxynitride film with the use of a known technique. The base film 102 may have a single layer or a laminated structure of two or more layers. In the present embodiment, two layers are formed as the base film 102, specifically, a silicon oxynitride film with a thickness from 10 to 100 nm is formed as a first base film 102*b* with a plasma CVD and a silicon oxynitride film (different composition ratio) with a thickness from 50 to 150 nm is formed as a second base film 102*a* with plasma CVD. It is noted that barium borosilicate glass is used as the substrate 101 in the present invention.

Next, a semiconductor film 104 is formed on the base film 102. As the semiconductor film 104, an amorphous semiconductor film is formed with a known means (sputtering, LPCVD, or plasma CVD) to have a thickness from 80 to 200 nm (preferably, 100 to 150 nm). Though a material of the semiconductor film is not limited, it is preferable to use silicon or germanium-silicon (SiGe) alloy to form the semiconductor film. In the present embodiment, an amorphous silicon film with a thickness of 150 nm is formed.

Next, a metal element that promotes crystallinity of a semiconductor film, such as nickel, iron, cobalt platinum, or palladium, is added to the semiconductor film 104 with the use of a known technique, and the semiconductor film 104 is crystallized with a known crystallization treatment such as laser crystallization or thermal crystallization. In the present embodiment, nickel acetate solution 105 (conversion of the concentration: 10 ppm by weight) is applied to on a entire surface of the semiconductor film 104, which is then exposed in a nitrogen atmosphere at 550° C. for 12 hours to form a crystalline semiconductor film 106.

Figure 2B:
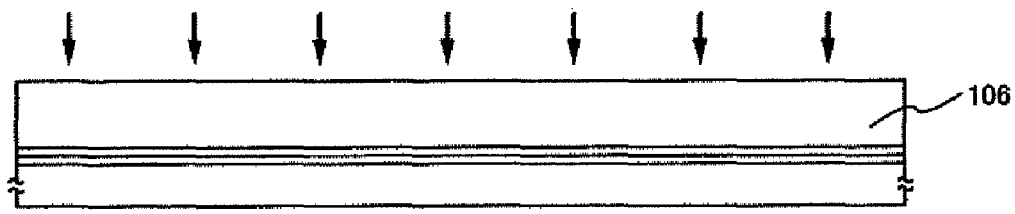

Next, a continuous wave laser beam is irradiated to the crystalline semiconductor film 106 to melt the crystalline semiconductor film 106, and the metal element, nickel in the present embodiment, included in the crystalline semiconductor film 106 is segregated in an upper portion of the semiconductor film 106 with cooling (FIG. 2B).

As the continuous wave laser beam, a continuous wave laser beam in a wavelength band absorbed in the crystallized semiconductor film, that is, a continuous wave laser beam that has a wavelength from 100 to 600 nm, is applied. As a laser oscillator, a gas laser oscillator or a solid laser oscillator is applied. As the gas laser oscillator, a laser oscillator using He—Ne, Ar or Kr is used. As the solid laser oscillator, a laser oscillator using a crystal such as YAG, YVO$_4$, YLF, or YAlO$_3$ doped with Cr, Nd, Er, Ho, Ce, Co, Ti, or Tm is applied. Alternatively, glass laser, ruby laser, alexandrite laser, or Ti:sapphire laser may be used as the solid laser. In the case of the solid laser oscillator, it is preferable to apply one of second to fourth harmonics of a fundamental wave.

In the case of using the laser above, it is effective to condense a laser beam emitted from a laser oscillator into a linear shape with an optical system to irradiate to a semiconductor film since the laser beam can be irradiated to a whole substrate for a short time.

Figure 2C:
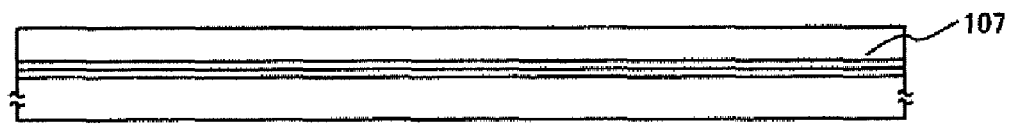

Subsequently, an explanation will be given with FIG. 2C. With wet etching, a region including the metal element is removed from the semiconductor film 106 to form a semiconductor film 107. As etchant, hydrazine, ethylenediamine, pyrocatechol solution (EPW), potassium hydroxide, or tetramethylammonium hydroxide solution (TMAH) may be used. In the present invention, etching of a region from the surface of the semiconductor film (the silicon film) to 50 nm in a depth direction, that is, a region including the metal element, is performed by soaking in tetramethylammonium hydroxide solution (TMAH) at 50° C. for 500 seconds. With this process, it is possible to remove the metal element from the semiconductor film 106 to become an active region or to reduce the metal element in the semiconductor film 106 to the extent that semiconductor characteristics are not influenced. Since the concentration of the metal element that becomes a path of leakage current is reduced, a thin film transistor including the thus manufactured active region has favorable characteristics with suppressed off-current as well as a high field effect mobility.

Figure 2D:
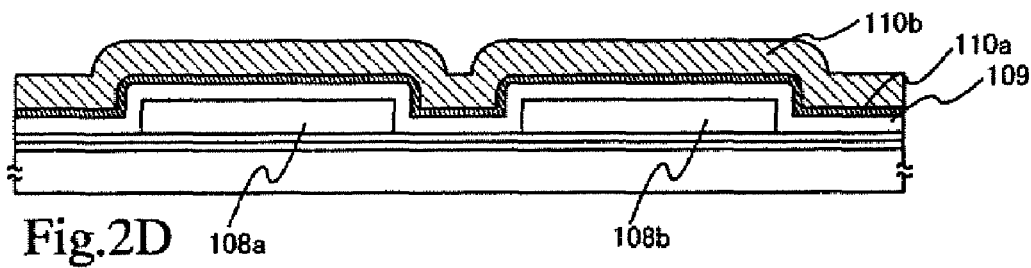

Next, an explanation will be given with FIG. 2D. After a mask (not shown in the figure) is formed with the use of techniques of photolithography, an unnecessary portion is removed with known etching to form semiconductor films 108a and 108b in a desired shape. In order to control threshold voltage of a thin film transistor, doping with a minute amount of impurity element (boron or phosphorous) may be performed after forming the semiconductor films 108a and 108b (not shown in the figure).

Then, a gate insulating film 109 with a thickness from 20 to 150 nm is formed with a known technique. In the present embodiment, plasma CVD is used at source gas flow rate of $SiH_4/N_2O=4/800$ (sccm) and at a deposition temperature of 400° C. to form a silicon oxynitride film with a thickness of 115 nm. Of course, the gate insulating film is not limited to the silicon oxynitride film, and other insulating films such as a silicon oxide film, a silicon oxynitride film (different composition ratio), a silicon nitride film may be used.

Next, a conductive film is formed with a known deposition method. In the present embodiment, a first conductive film 110a of a tantalum nitride film with a thickness of 30 nm and a second conductive film 110b of a tungsten film with a thickness of 370 nm are laminated. The tantalum nitride film and the tungsten film are formed with sputtering.

Although the first and second conductive films 110a and 110b are respectively formed of the tantalum nitride and the tungsten film in the present embodiment, there is no particular limitation, and each of the first and second conductive films 110a and 110b may be formed of an element selected from tantalum (Ta), tungsten (W), titanium (Ti), molybdenum (Mo), aluminum (Al), copper (Cu), chromium (Cr), or neodymium (Ed), or an alloy or a compound containing the element as its main component. Alternatively, silver-copper-palladium alloy (AgPdCu alloy) may be used.

Figure 3A:
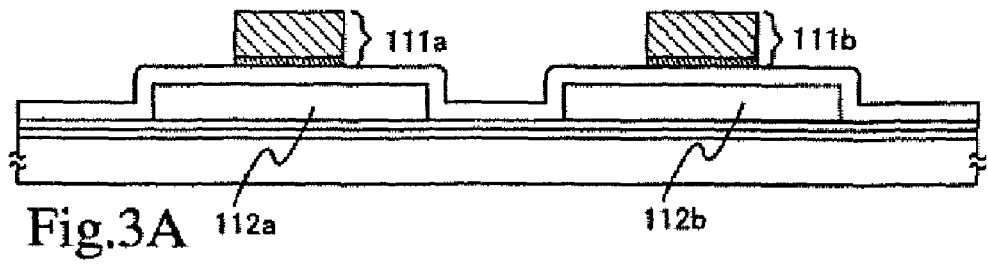
FIGS. 3A to 3C are sectional views showing a manufacturing process of the thin film transistor.

Next, an explanation will be given with FIG. 3A. After a mask (not in the figure) is formed with the use of techniques of photolithography, an unnecessary portion of the first and second conductive films 110a and 110b is removed with a known method such as RIE or ECR to form gate electrodes 111a and 111b.

Figure 3B:
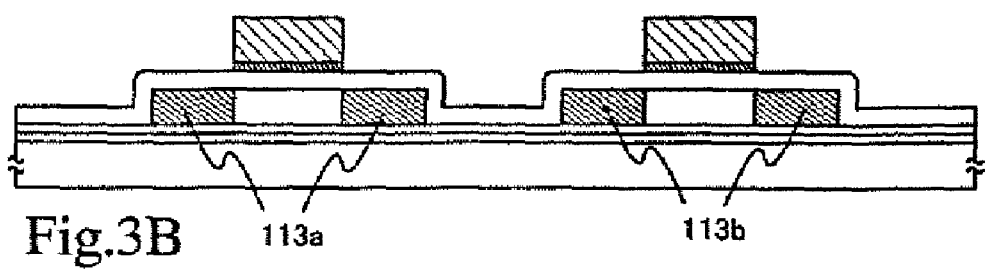

Next, an explanation will be given with FIG. 3B. While the gate electrodes 111a and 111b are used as masks, semiconductor films 112a and 112b are doped with an impurity element with a known technique such as ion doping or ion implantation to form source and drain regions 113a and 113b. The process above is conducted under conditions of a dose amount from $1\times10^{13}$ to $5\times10^{14}/cm^2$ and an accelerating voltage from 30 to 120 keV.

In the present embodiment, the dose amount of an impurity and the accelerating voltage are respectively set to $2\times10^{13}/cm^2$ and 90 keV in doping with an n-type impurity. As an impurity element that imparts an n-type, an element that belongs to Group 15 of the periodic table, typically, phosphorous (P) or arsenic (As) is used. In the present embodiment, a compound including phosphorous (P) is used as the impurity. On the other hand, the dose amount of the impurity and the accelerating voltage are respectively set to $3\times10^{13}/cm^2$ and 60 keV in doping with an p-type impurity. As an impurity element that imparts a p-type, an element that belongs to Group 13 of the periodic table, typically, boron (B) can be used.

Then, thermal treatment is conducted to recover the crystallinity of the semiconductor films and to activate the impurity element introduced in the semiconductor films. As a method for the thermal treatment, thermal annealing using an annealing furnace, laser annealing, or rapid thermal annealing (RTA) can be applied. In the present embodiment, thermal annealing is used to heat in an nitrogen atmosphere at 550° C. for 4 hours.

Figure 3C:
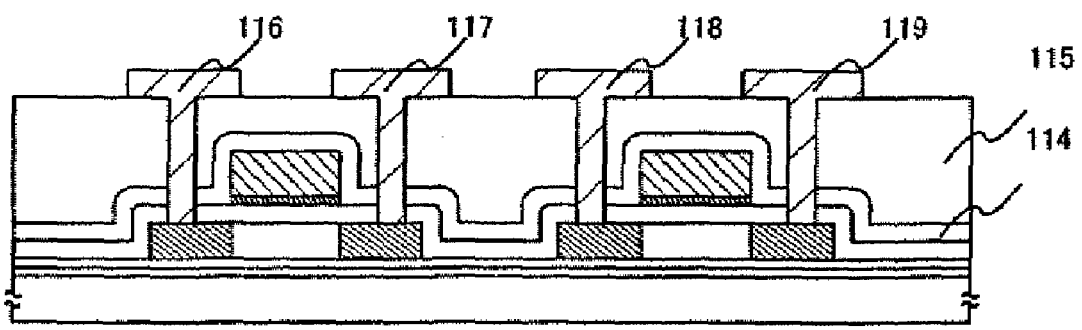
Figure 4:
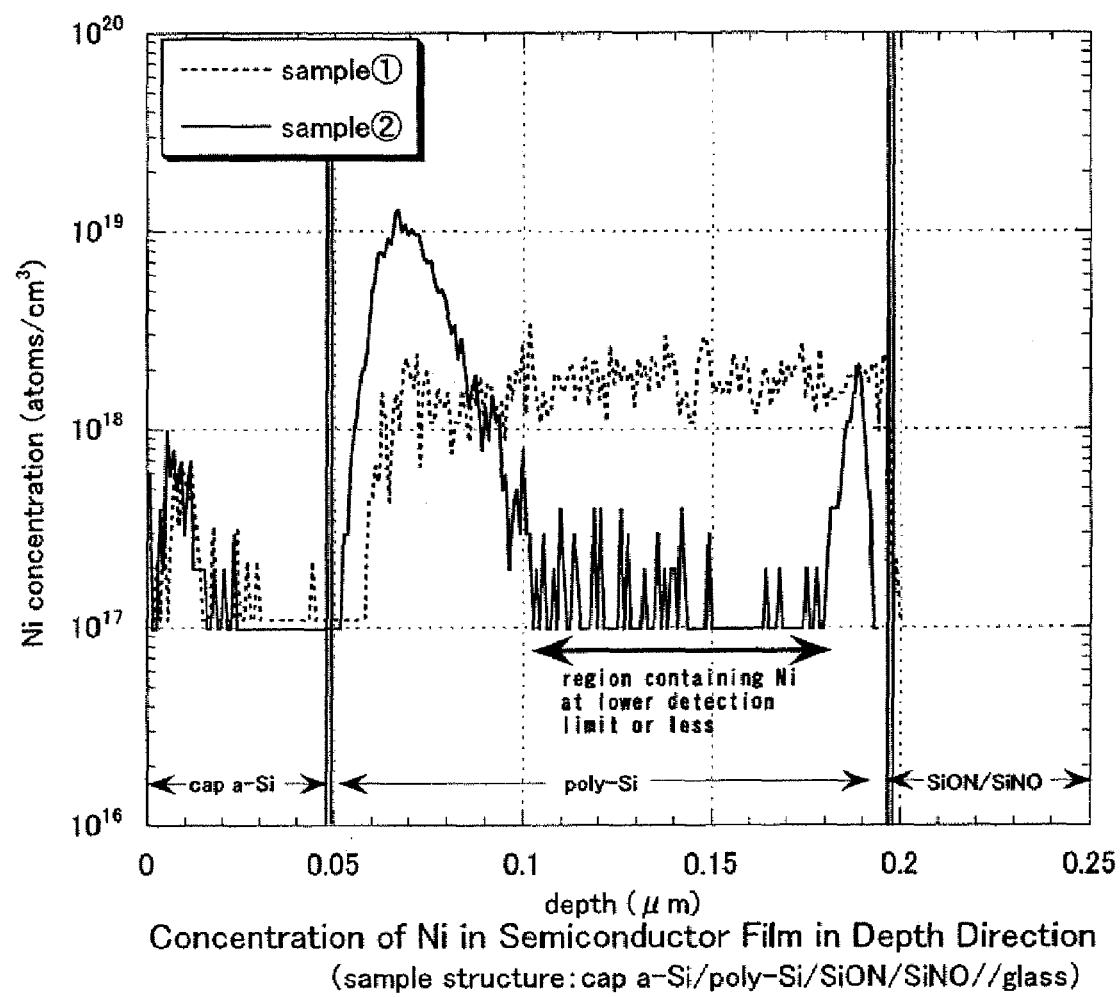
FIG. 4 is a graph showing a concentration of nickel in a semiconductor film.

Next, an explanation will be given with FIG. 3C. After first and second interlayer insulating films 114 and 115 are formed, treatment such as CMP (Chemical Mechanical Polishing) may be conducted for planarization of a surface of the interlayer insulating films. The first interlayer insulating film 114 may have a singe-layer structure or a laminated structure. In the present embodiment, plasma CVD is used to form a silicon nitride film with a thickness of 50 nm as the first interlayer insulating film 114, and similarly to form a silicon oxide film with a thickness of 400 nm as the second interlayer insulating film 115. As the second interlayer insulating film 115, a film including an inorganic insulating material or an organic insulating material may be formed.

Before forming the second interlayer insulating film on the first interlayer insulating film, thermal treatment (at a temperature from 300 to 550° C. for 1 to 12 hours) may be performed for hydrogenation. This process is performed for terminating a dangling bond of the semiconductor film with hydrogen included in the first interlayer insulating film 114. Alternatively, plasma hydrogenation (using hydrogen excited by plasma) or thermal treatment at a temperature from 300 to 450° C. for 1 to 12 hours in an atmosphere including hydrogen from 3 to 100% may be performed for hydrogenation. In the present embodiment mode, heating at 410° C. for 1 hour is conducted in a nitrogen atmosphere.

Then, contact holes are formed to reach source and drain regions 113a and 113b, and wirings 116 to 119 electrically connected to the source and drain regions 113a and 113b respectively are formed.

As set forth above, the contact holes are formed to reach the semiconductor films and the wirings 116 to 119 are formed. In order to form the wirings 116 to 119, etching is conducted to a laminate film of a titanium film with a thickness of 100 mm, an alloy film (typically, an alloy film of aluminum and silicon) with a thickness of 350 nm, and a titanium film with a thickness of 100 nm. As a material of the wiring, other materials with low resistance may be used in addition to Ti and alloy of Al and Si.

Embodiment 2

In the present embodiment, another process for removing the region in which the metal element is segregated in the upper portion of the semiconductor film will be shown concerning the thin film transistor formed according to the manufacturing method described in Embodiment 1.

According to Embodiment 1, the continuous wave laser beam is irradiated to the crystalline semiconductor film to segregate the metal element, typically, nickel, in the upper portion of the semiconductor film. After that, the surface of the semiconductor film is polished with CMP (Chemical Mechanical Polishing) to remove the region including the metal element form the semiconductor film. In the present embodiment, polishing liquid including silicon oxide as slurry is used to polish the surface of the semiconductor film. In polishing, the polishing condition may be appropriately determined in accordance with a state of the semiconductor film, such as a film thickness. With the polishing process, it is possible to remove the metal element in the semiconductor film including an active layer as well as planarization of a surface of a thin film transistor. Namely, the thin film transistor manufactured according to this process has favorable characteristics with suppressed off-current as well as a high field effect mobility since the concentration of the metal element that becomes a path of leakage current is reduced.

Embodiment 3

In the present embodiment, similarly to Embodiment 2, another process for removing the region in which the metal element is segregated in the upper portion of the semiconductor film will be shown concerning the thin film transistor formed according to the manufacturing method described in Embodiment 1.

According to Embodiment 1, the continuous wave laser beam is irradiated to the crystalline semiconductor film to segregate the metal element, typically, nickel, in the upper portion of the semiconductor film. After that, dry etching is used to remove the region including the metal element from the semiconductor film. In dry etching, the condition may be appropriately determined in accordance with a state of the semiconductor film, such as a film thickness. In the present embodiment, the etching condition is set to $CF_4/O_2=50/45$ (sccm), and the upper portion from the surface of the semiconductor film to 50 nm is etched.

Consequently, it is possible to remove the metal element in the semiconductor film including an active layer to reduce the concentration of the remaining metal element. Namely, the thin film transistor manufactured according to this process has favorable characteristics with suppressed off-current as well as a high field effect mobility since the concentration of the metal element that becomes a path of leakage current is reduced.

Embodiment 4

Although the examples of applying the present invention to a manufacturing method of a thin film transistor are shown in Embodiments 1 to 3, there is no particular limitation. The present invention is applicable to semiconductor devices using a semiconductor film such as a thin film diode and a field emission device Embodiment 5

When the present invention is applied, it is possible to fabricate various devices such as an electro-optical device, a light emitting device, and a semiconductor circuit. Namely, the present invention can be applied to various electronic devices in which the devices are respectively mounted.

The following can be given as such electronic devices: a video camera; a digital camera, a projector; a head mounted display (a goggle type display); a car navigation system; a car stereo; a personal computer; a mobile information terminal (a mobile computer, a mobile phone, or an electronic book); etc. Examples of the electronic devices are shown in FIGS. 5A to 5F, 6A to 6D and 7A to 7C.

FIG. 5A is a personal computer which includes a main body 3001, an image input portion 3002, a display portion 3003, and a keyboard 3004. When the present invention is applied, it is possible to manufacture, with high yield, a personal computer that enables high-resolution display with low power consumption.

FIG. 5B is a video camera which includes a main body 3101, a display portion 3102, a voice input portion 3103, operation switches 3104, a battery 3105, and an image receiving portion 3106. When the present invention is applied, it is possible to manufacture, with high yield, a video camera that enables high-resolution display.

FIG. 5C is a mobile computer which includes a main body 3201, a camera section 3202, an image receiving portion 3203, an operation switch 3204 and a display portion 3205. When the present invention is applied, it is possible to manufacture, with high yield, a mobile computer that enables high-resolution display with low power consumption.

FIG. 5D is a goggle type display which includes a main body 3301, a display portion 3302, and an arm portion 3303. When the present invention is applied, it is possible to manufacture, with high yield, a goggle type display that enables high-resolution display.

FIG. 5E is a player that uses a recording medium recording a program (hereinafter, referred to as a recording medium) which includes a main body 3401, a display portion 3402, a speaker portion 3403, a recording medium 3404; and operation switches 3405. The player uses DVD (digital versatile disc), CD, etc. as the recording medium, and can be used for music appreciation, film appreciation, games, and Internet. When the present invention is applied, it is possible to manufacture, with high yield, a player that enables high-resolution display.

FIG. 5F is a digital camera which includes a main body 3501, a display portion 3502; a view finder 3503, operation switches 3504, and an image receiving portion (not shown in the figure). When the present invention is applied, it is possible to manufacture, with high yield, a digital camera that enables high-resolution display with low power consumption.

Figure 6A:
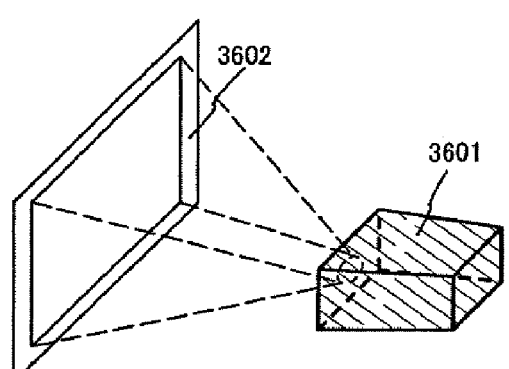
FIGS. 6A to 6D are diagrams showing examples of electronic apparatus.

FIG. 6A is a front type projector which includes a projection system 3601 and a screen 3602. When the present invention is applied, it is possible to manufacture, with high yield, a front type projector that enables high luminance.

Figure 6B:
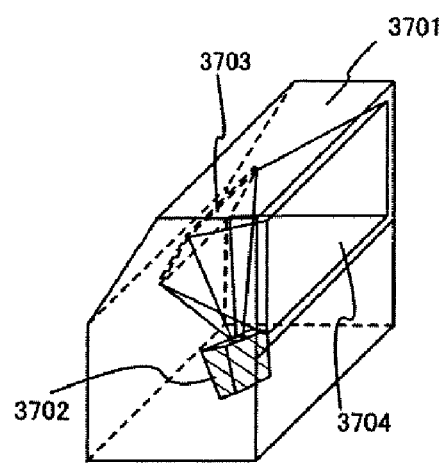

FIG. 6B is a rear type projector which includes a main body 3701, a projection system 3702, a mirror 3703, and a screen 3704. When the present invention is applied, it is possible to manufacture, with high yield, a rear type projector that enables high luminance.

Figure 6C:
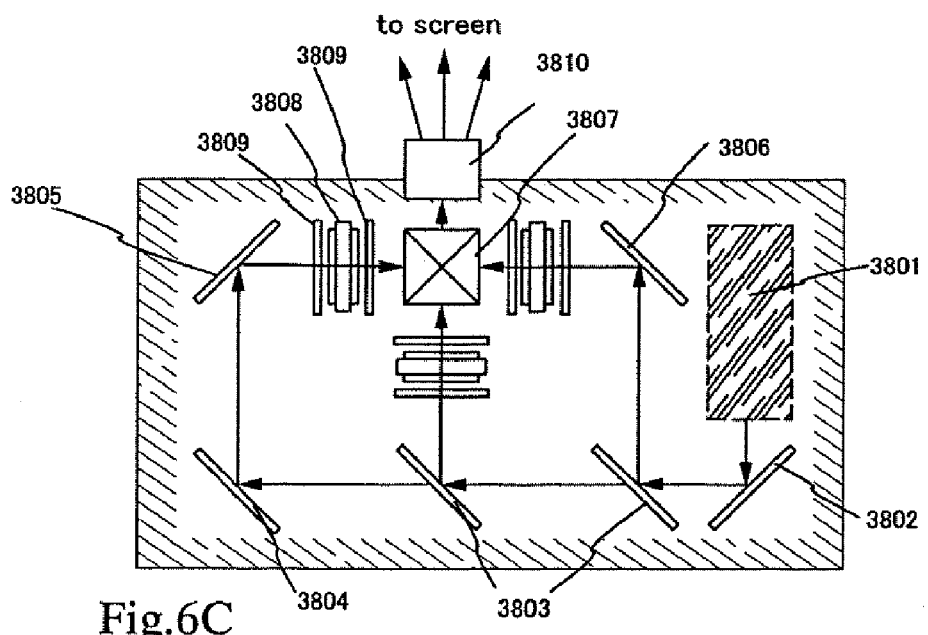

FIG. 6C is a diagram which shows an example of structures of projection systems 3601 and 3702 respectively in FIGS. 6A and 6B. Each of the projection systems 3601 and 3702 includes a light source optical system 3801, mirrors 3802 and 3804 to 3806, a dichroic mirror 3803, a prism 3807, a liquid crystal display device 3808, a retardation plate 3809; and a projection optical system 3810. The projection optical system 3810 comprises an optical system including a projection lens. Though the present embodiment shows an example of 3-plate type, there is no particular limitation, and a single-plate type may be used for instance. Further, an optical system such as an optical lens, a film that has a function of polarizing light, a film for adjusting a phase difference, or an IR film may appropriately be disposed in the optical path shown by an arrow in FIG. 6C.

Figure 6D:
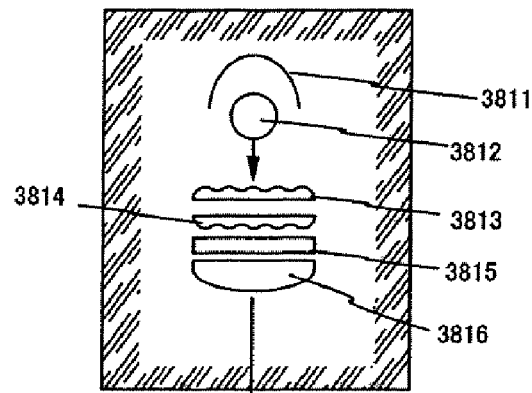

FIG. 6D is a diagram showing an example of a structure of the light source optical system 3801 in FIG. 6C. In the present embodiment, the light source optical system 3801 includes a reflector 3811, a light source 3812, lens arrays 3813 and 3814, a polarizing conversion element 3815, and a condenser lens 3816. Note that the light source optical system shown in FIG. 6D is merely an example and the structure is not particularly limited. For instance, an optical system such as an optical lens, a film that has a function of polarizing light, a film for adjusting a phase difference, or an IR film may appropriately be disposed in the light source optical system.

Note that a transmission type electro-optical device is used in the case of the projectors shown in FIGS. 6A to 6D, and examples of applying a reflection type electro-optical device and a light emitting device are not shown in the figures.

FIG. 7A is a mobile phone which includes a main body 3901, a voice output portion 3902, a voice input portion 3903, a display portion 3904, operation switches 3905, and an antenna 3906. When the present invention is applied to the display portion 3904, it is possible to manufacture, with high yield, a mobile phone that enables high-resolution display with low power consumption.

FIG. 7B is a portable book (electronic book) which includes a main body 4001, display portions 4002 and 4003, a recording medium 4004, operation switches 4005, and an antenna 4006. When the present invention is applied to the display portions 4002 and 4003, it is possible to manufacture, with high yield, a portable book that enables high-resolution display with low power consumption.

FIG. 7C is a display which includes a main body 4101, a supporting section 4102, and a display portion 4103. In the case of a large-sized screen, a display to which the present invention is applied is particularly advantageous, and advantageous to a display with diagonally 10 inches or more (particularly, a 30 inches or more).

As described above, the present invention can be fairly widely applied to electronic devices in various fields. Note that the electronic devices in the present embodiment can be achieved in combination with any constitution of Embodiments 1 to 4.

In the process of crystallizing a semiconductor film with the use of a metal element, it is possible to manufacture a thin film transistor comprised of a crystalline semiconductor film more simply with fewer processes than conventionally by irradiating a continuous wave laser light to a crystalline semiconductor film. Namely, according to the present invention, the crystal orientation can be enhanced in a single direction, and a thin film transistor composed of a semiconductor film composed of crystal grains with a large grain size can be formed with high yield. In addition, according to the present invention, the improvement in yield can be realized similarly also in a method for manufacturing a semiconductor device, which used a semiconductor film with a crystalline structure.

What is claimed is:

1. A method for manufacturing a semiconductor device, comprising:
    forming an amorphous semiconductor film over an insulating surface;
    adding a metal element for promoting crystallization to an entire upper surface of the amorphous semiconductor film;
    heating the amorphous semiconductor film to form a crystallized semiconductor film;
    irradiating the crystallized semiconductor film with a laser beam from above an upper surface of the crystallized semiconductor film; and
    removing an upper portion of the crystallized semiconductor film by etching after irradiation of the laser beam, the upper portion including the metal element and the upper surface,
    wherein the upper portion is at least 50 nm thick.

2. The method according to claim 1, wherein the metal element is nickel.

3. The method according to claim 1, wherein the metal element is segregated in the upper portion of the crystallized semiconductor film by irradiating the crystallized semiconductor film with the laser beam so that the crystallized semiconductor film is recrystallized.

4. The method according to claim 1, wherein the etching is wet etching or dry etching.

5. A method for manufacturing a semiconductor device, comprising:
    forming an amorphous semiconductor film over an insulating surface;
    adding a metal element for promoting crystallization to an entire upper surface of the amorphous semiconductor film;
    heating the amorphous semiconductor film to form a crystallized semiconductor film;
    irradiating the crystallized semiconductor film with a laser beam from above an upper surface of the crystallized semiconductor film;
    removing an upper portion of the crystallized semiconductor film by etching after irradiation of the laser beam, the upper portion including the metal element and the upper surface; and
    patterning the crystallized semiconductor film into a shape after removing the upper portion of the crystallized semiconductor film,
    wherein the upper portion is at least 50 nm thick.

6. The method according to claim 5, wherein the metal element is nickel.

7. The method according to claim 5, wherein the metal element is segregated in the upper portion of the crystallized semiconductor film by irradiating the crystallized semiconductor film with the laser beam so that the crystallized semiconductor film is recrystallized.

8. The method according to claim 5, wherein the etching is wet etching or dry etching.

9. A method for manufacturing a semiconductor device, comprising:
    forming an amorphous semiconductor film over an insulating surface;
    adding a metal element for promoting crystallization to an entire upper surface of the amorphous semiconductor film;
    heating the amorphous semiconductor film to form a crystallized semiconductor film;
    irradiating the crystallized semiconductor film with a laser beam from above an upper surface of the crystallized semiconductor film;
    removing an upper portion of the crystallized semiconductor film by etching after irradiation of the laser beam, the upper portion including the metal element and the upper surface;
    patterning the crystallized semiconductor film into a shape after removing the upper portion of the crystallized semiconductor film; and
    forming a gate insulating film over the patterned crystallized semiconductor film,
    wherein the upper portion is at least 50 nm thick.

10. The method according to claim 9, wherein the metal element is nickel.

11. The method according to claim 9, wherein the metal element is segregated in the upper portion of the crystallized semiconductor film by irradiating the crystallized semiconductor film with the laser beam so that the crystallized semiconductor film is recrystallized.

12. The method according to claim 9, wherein the etching is wet etching or dry etching.

13. A method for manufacturing a semiconductor device, comprising:
    forming an amorphous semiconductor film over an insulating surface;
    adding a metal element for promoting crystallization to an entire upper surface of the amorphous semiconductor film;
    heating the amorphous semiconductor film to form a crystallized semiconductor film;

irradiating the crystallized semiconductor film with a laser beam from above an upper surface of the crystallized semiconductor film;

removing an upper portion of the crystallized semiconductor film by using CMP after irradiation of the laser beam, the upper portion including the metal element and the upper surface; and patterning the crystallized semiconductor film into a shape after removing the upper portion of the crystallized semiconductor film, wherein the upper portion is at least 50 nm thick.

14. The method according to claim 13, wherein the metal element is nickel.

15. The method according to claim 13, wherein the metal element is segregated in the upper portion of the crystallized semiconductor film by irradiating the crystallized semiconductor film with the laser beam so that the crystallized semiconductor film is recrystallized.

16. The method according to claim 13, wherein a gate insulating film is formed over the patterned crystallized semiconductor film.

* * * * *

UNITED STATES PATENT AND TRADEMARK OFFICE
CERTIFICATE OF CORRECTION

PATENT NO. : 7,863,114 B2
APPLICATION NO. : 11/971085
DATED : January 4, 2011
INVENTOR(S) : Shinji Maekawa et al.

It is certified that error appears in the above-identified patent and that said Letters Patent is hereby corrected as shown below:

column 2, line 10, "beating temperature and an appropriate beating" should read "heating temperature and an appropriate heating"

column 6, line 52, "10 to 200 mm" should read "10 to 200 nm"

column 9, line 36, "(Ed)" should read "(Nd)"

column 10, lines 38-39, "100 mm" should read "100 nm"

Signed and Sealed this
Fifth Day of April, 2011

David J. Kappos
*Director of the United States Patent and Trademark Office*